(12) United States Patent
Park et al.

(10) Patent No.: US 9,929,104 B2
(45) Date of Patent: Mar. 27, 2018

(54) SEMICONDUCTOR DEVICE INCLUDING AN OPTICAL MEASUREMENT PATTERN

(71) Applicant: SAMSUNG ELECTRONICS CO., LTD., Suwon-si, Gyeonggi-Do (KR)

(72) Inventors: Young-Sik Park, Hwaseong-si (KR); Yi-Gwon Kim, Hwaseong-si (KR); Yong-Kug Bae, Hwaseong-si (KR); Sung-Won Choi, Yongin-si (KR); Hee-Ho Ku, Hwaseong-si (KR); Ga-Hyun Yang, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/290,921

(22) Filed: Oct. 11, 2016

(65) Prior Publication Data

US 2017/0221832 A1     Aug. 3, 2017

(30) Foreign Application Priority Data

Feb. 2, 2016 (KR) .......................... 10-2016-0012906

(51) Int. Cl.
*H01L 29/06* (2006.01)
*H01L 23/544* (2006.01)
(Continued)

(52) U.S. Cl.
CPC ........ *H01L 23/544* (2013.01); *G03F 7/70633* (2013.01); *H01L 22/20* (2013.01);
(Continued)

(58) Field of Classification Search
CPC ..... H01L 23/544; H01L 22/20; H01L 23/552; H01L 2223/54426; H01L 2223/5446
See application file for complete search history.

(56) References Cited

U.S. PATENT DOCUMENTS 5,567,643 A * 10/1996 Lee ..................... H01L 23/5256
257/E23.149
6,218,263 B1    4/2001 Chung et al.
(Continued)

FOREIGN PATENT DOCUMENTS

JP          09-232207        9/1997
KR      1020010048281      6/2001
(Continued)

OTHER PUBLICATIONS

ASML, L14 uDBO Jan. MTO Proposals, Jan. 26, 2014, pp. 1-29.
(Continued)

*Primary Examiner* — Sitaramarao S Yechuri
(74) *Attorney, Agent, or Firm* — F. Chau & Associates, LLC

(57) ABSTRACT

A semiconductor device includes a substrate including at least two semiconductor chip regions and a scribe lane region disposed between the semiconductor chip regions. The semiconductor device additionally includes a first optical measurement pattern disposed on the substrate. The semiconductor device further includes a second optical measurement pattern disposed on an upper layer of the first optical measurement pattern, the second optical measurement pattern being spaced apart from the first optical measurement pattern. The semiconductor device additionally includes a three-dimensional (3D) shielding structure surrounding the first optical measurement pattern and including an electrically conductive material.

20 Claims, 16 Drawing Sheets

(51) Int. Cl.
  *H01L 21/66* (2006.01)
  *H01L 23/552* (2006.01)
  *G03F 7/20* (2006.01)
(52) U.S. Cl.
  CPC .... *H01L 23/552* (2013.01); *H01L 2223/5442* (2013.01); *H01L 2223/5446* (2013.01); *H01L 2223/54426* (2013.01)

(56) References Cited

U.S. PATENT DOCUMENTS

| | | | |
|---|---|---|---|
| 6,380,049 B1* | 4/2002 | Hamada | G03F 9/7084 |
| | | | 257/797 |
| 6,617,669 B2 | 9/2003 | Saito | |
| 6,723,614 B2 | 4/2004 | Sugiyama | |
| 7,723,203 B2 | 5/2010 | Kim | |
| 7,982,273 B2 | 7/2011 | Chen et al. | |
| 8,373,288 B2 | 2/2013 | Nakajima | |
| 9,087,982 B2 | 7/2015 | Watanabe et al. | |
| 2006/0033204 A1* | 2/2006 | Fraser | H01L 23/5225 |
| | | | 257/708 |
| 2009/0206411 A1* | 8/2009 | Koketsu | H01L 23/544 |
| | | | 257/368 |
| 2014/0094015 A1* | 4/2014 | Kasa | H01L 23/544 |
| | | | 438/401 |
| 2014/0192338 A1 | 7/2014 | Den Boef | |

FOREIGN PATENT DOCUMENTS

| | | |
|---|---|---|
| KR | 1020020040446 | 5/2002 |
| KR | 1020050069165 | 7/2005 |
| KR | 1020070014613 | 2/2007 |
| KR | 1020090118662 | 11/2009 |
| KR | 1020100072886 | 7/2010 |

OTHER PUBLICATIONS http://www.physics.montana.edu/demonstrations/video/5_electricityandmagnetism/demos/radioinfaradaycage.html.
S. Jonathan Chapman, et al., "Mathematics of the Faraday Cage," Siam Review, 2015, vol. 57, No. 3, pp. 398-417.

* cited by examiner

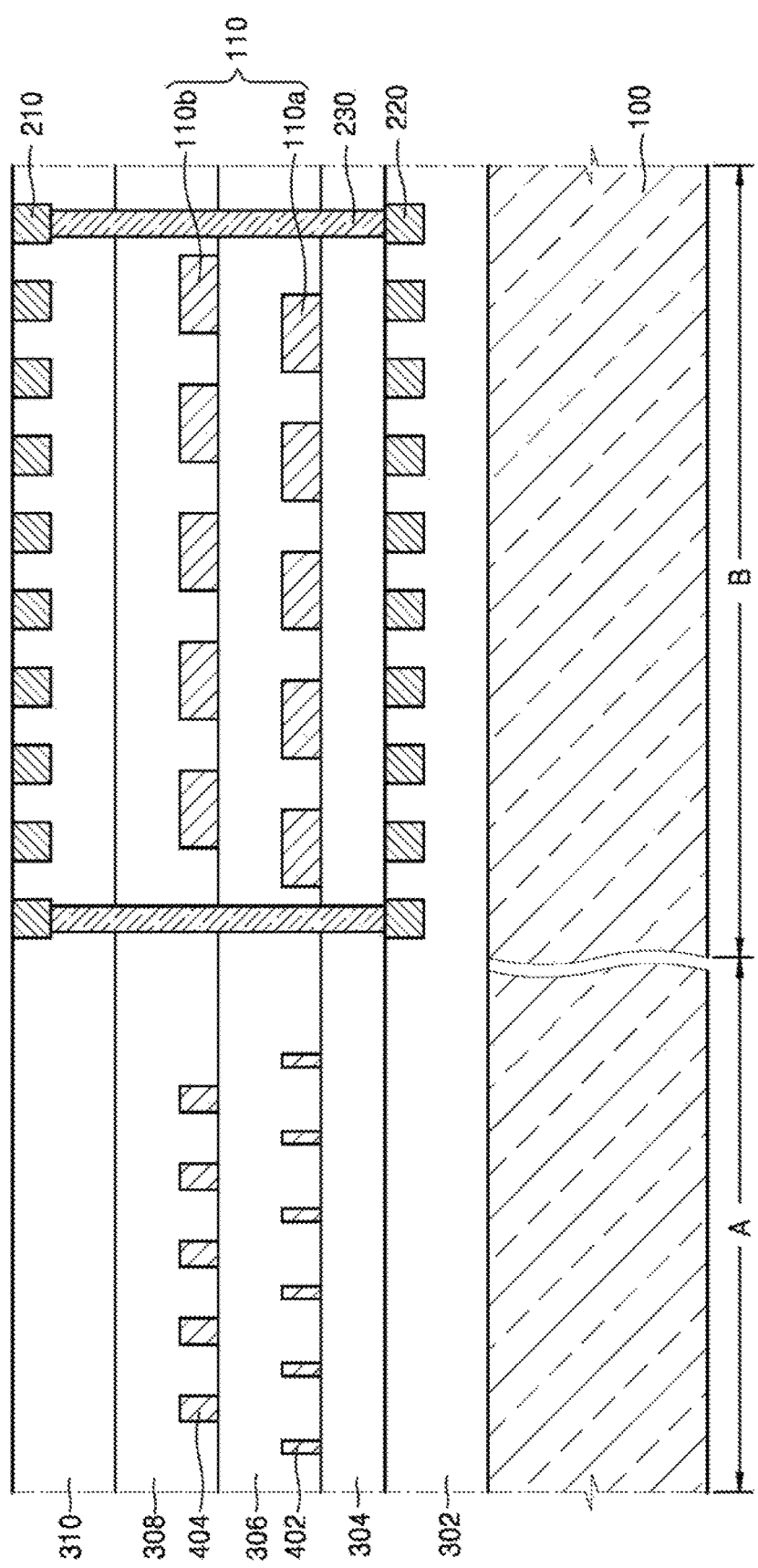

SEMICONDUCTOR DEVICE INCLUDING AN OPTICAL MEASUREMENT PATTERN

CROSS-REFERENCE TO RELATED APPLICATION

This application claims priority under 35 U.S.C. § 119 to Korean Patent Application No. 10-2016-0012906, filed on Feb. 2, 2016, in the Korean Intellectual Property Office, the disclosure of which is incorporated by reference herein in its entirety.

TECHNICAL FIELD

Exemplary embodiments of the present inventive concept relate to a semiconductor device, and more particularly, to a semiconductor device including an optical measurement pattern.

DISCUSSION OF THE RELATED ART

As semiconductor devices become smaller and include an increasingly larger number of circuit elements, it is important that photolithography processes are able to achieve a higher degree of accuracy. In this regard, an optical measurement pattern capable of allowing a precise measurement of a state of a semiconductor substrate is desired. However, the space of the optical measurement pattern may increase as more patterns are used to fabricate a greater number of layers on the semiconductor substrate.

SUMMARY

According to an exemplary embodiment of the present inventive concept, a semiconductor device includes a substrate including at least two semiconductor chip regions and a scribe lane region disposed between the semiconductor chip regions. The semiconductor device additionally includes a first optical measurement pattern disposed on the substrate. The semiconductor device further includes a second optical measurement pattern disposed on an upper layer of the first optical measurement pattern, the second optical measurement pattern being spaced apart from the first optical measurement pattern. The semiconductor device additionally includes a three-dimensional (3D) shielding structure surrounding the first optical measurement pattern and including an electrically conductive material.

According to an exemplary embodiment of the present inventive concept, a semiconductor device includes a pair of first optical measurement patterns disposed over a semiconductor chip and vertically spaced apart from one another. The semiconductor device further includes a pair of second optical measurement patterns spaced apart from the first optical measurement pattern, the pair of second optical measurement pattern being disposed above an upper layer of the first optical measurement pattern, and vertically spaced apart from one another. The semiconductor device additionally includes a three-dimensional (3D) shielding structure surrounding the first optical measurement pattern and including at least one surface including a mesh-type electrically conductive wiring.

According to an exemplary embodiment of the present inventive concept, a semiconductor device includes a substrate and a pair of first optical measurement patterns disposed over the substrate and spaced apart from one another. The semiconductor device further includes a pair of second optical measurement patterns spaced apart from one another and disposed over the pair of first optical measurement patterns. The semiconductor device additionally includes a three-dimensional (3D) shielding structure surrounding the first optical measurement pattern and including an upper end and a lower end.

BRIEF DESCRIPTION OF THE DRAWINGS

The above and other features of the present inventive concept will become more apparent by describing in detail exemplary embodiments thereof, with reference to the accompanying drawings, in which:

FIGS. 4A through 4G are cross-sectional views of a semiconductor device in order to illustrate a process of manufacturing the semiconductor device, according to an exemplary embodiment of the present inventive concept;

DETAILED DESCRIPTION OF THE EMBODIMENTS

Exemplary embodiments of the present inventive concept will now be described more fully hereinafter with reference to the accompanying drawings. The present disclosure may, however, have different forms and should not be construed as being limited to the exemplary embodiments set forth herein.

Figure 1A:
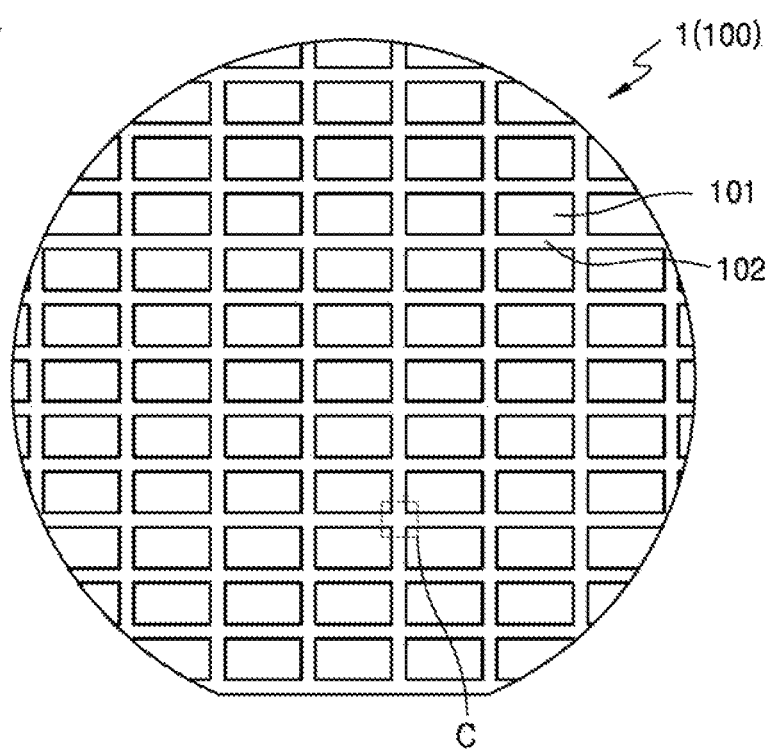
FIGS. 1A and 1B are schematic plan views illustrating a substrate including a plurality of semiconductor chips and scribe lane regions separating the semiconductor chips, according to an exemplary embodiment of the present inventive concept.
Figure 1B:
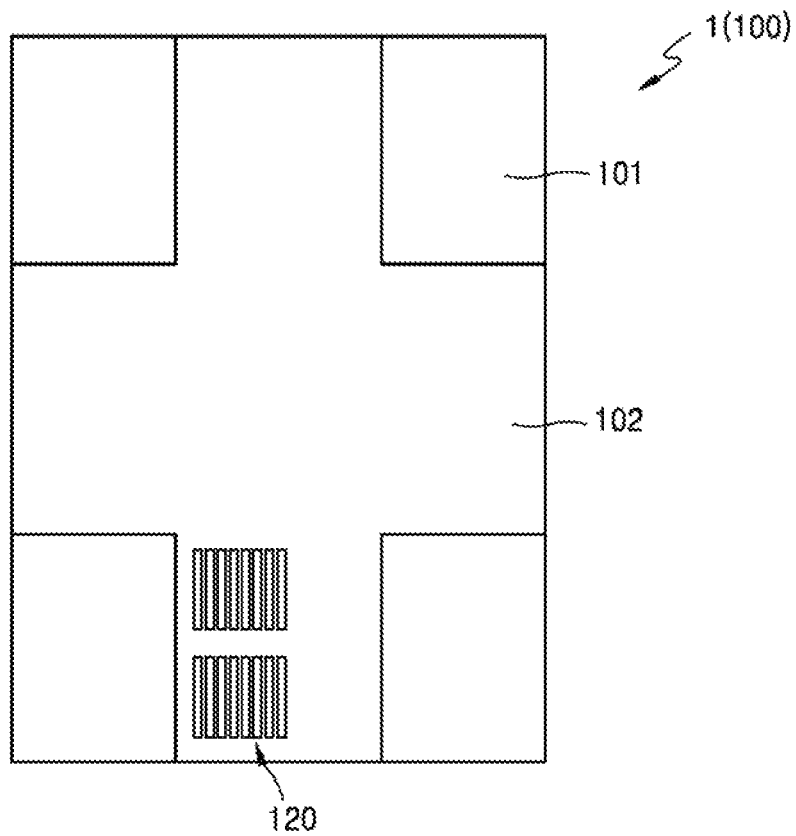

FIGS. 1A and 1B are schematic plan views illustrating a substrate including a plurality of semiconductor chips and scribe lane regions separating the semiconductor chips, according to an exemplary embodiment of the present inventive concept. FIG. 1A is an expanded plan view of the semiconductor chips and a C region, which is one of the scribe lane regions of FIG. 1A.

Referring to FIGS. 1A and 1B, a semiconductor device 1 according to an exemplary embodiment of the present inventive concept may include a substrate 100. The substrate 100 may include a semiconductor chip region 101 and a scribe lane region 102 separating the semiconductor chip region 101 from another semiconductor chip region 101. The scribe lane region 102 may be between each semiconductor chip region 101. The scribe lane region 102 is a region of a surface of the substrate 100 where nicks may be laterally and longitudinally cut with a diamond cutter or a laser to divide the substrate 100 into a plurality of semiconductor chip regions 101. Each semiconductor chip region 101 may include one of a plurality of semiconductor chips. A semiconductor device and circuit patterns of FIGS. 4A through 4G may be formed in the semiconductor chip region 101.

A substrate 100 may include silicon (Si), germanium (Ge), silicon-germanium (SiGe), gallium phosphide (GaP), gallium arsenide (GaAs), silicon carbide (SiC), silicon germanium carbon (SiGeC), indium arsenide (InAs), or indium phosphide (InP). Furthermore, the substrate 100 may be a high-rigidity substrate such as a silicon substrate, a silicon on insulator (SOI) substrate, a gallium arsenic substrate, a silicon germanium substrate, a ceramic substrate, a quartz substrate, or a glass substrate. The substrate may alternatively be a flexible plastic substrate such as polyimide, polyesterpolycarbonate, polyethersulfone, polymethylmethacrylate, polyethylenenaphthalate, or polyethyleneterephthalate.

The substrate 100 may be a first conductive (e.g., a P-type) substrate, or may be formed by growing and etching a first conductive (e.g., a P-type) epitaxial layer. Furthermore, the substrate 100 may be formed by etching a first conductive (e.g., an N-type) substrate.

Figure 2A:
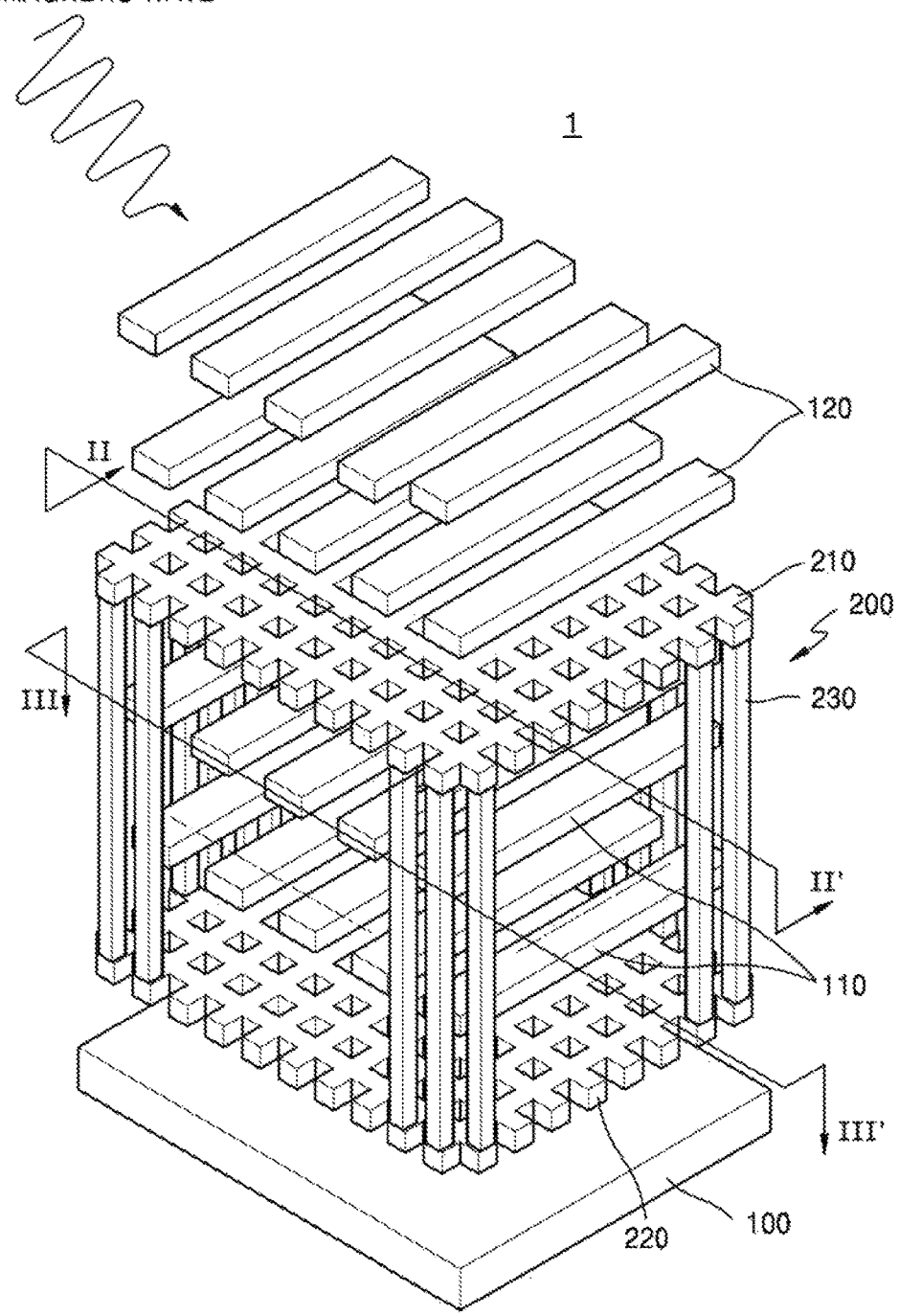
FIG. 2A is a perspective view illustrating a three-dimensional (3D) shielding structure of a semiconductor device, according to an exemplary embodiment of the present inventive concept.
Figure 2B:
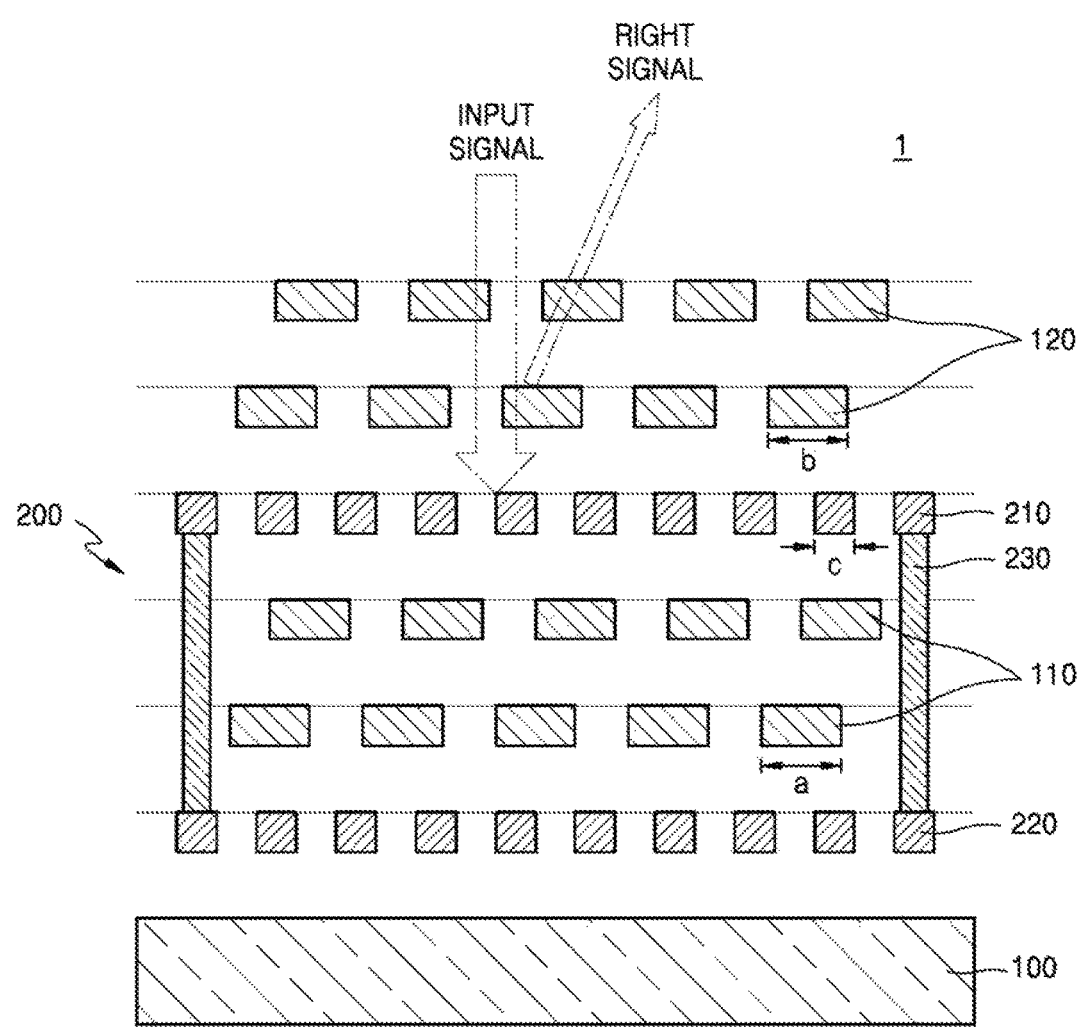
FIG. 2B is a cross-sectional view illustrating the 3D shielding structure of the semiconductor device of FIG. 2A, taken along a line II-II', according to an exemplary embodiment of the present inventive concept.
Figure 2C:
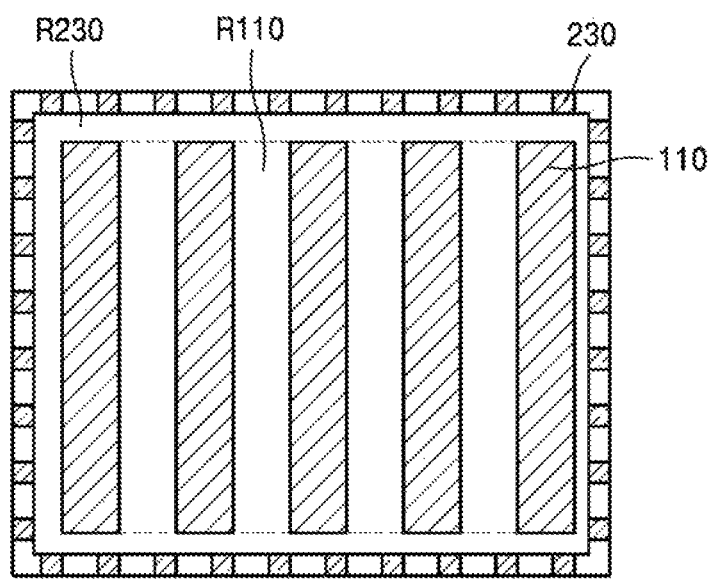
FIG. 2C is a cross-sectional view illustrating the 3D shielding structure of the semiconductor device of FIG. 2A, taken along a line III-III', according to an exemplary embodiment of the present inventive concept.

FIG. 2A is a perspective view illustrating a three-dimensional (3D) shielding structure of a semiconductor device 1, according to an exemplary embodiment of the present inventive concept. FIG. 2B is a cross-sectional view illustrating the 3D shielding structure of the semiconductor device 1 of FIG. 2A, taken along a line II-II', according to an exemplary embodiment of the present inventive concept. FIG. 2C is a cross-sectional view illustrating the 3D shielding structure of the semiconductor device 1 of FIG. 2A, taken along a line III-III', according to an exemplary embodiment of the present inventive concept.

Referring to FIGS. 2A and 2B, the semiconductor device 1 according to an exemplary embodiment of the present inventive concept may include the substrate 100. The substrate 100 may include at least two semiconductor chip regions 101 and a scribe lane region 102 separating the semiconductor chip regions 101. In addition, a first optical measurement pattern 110 may be disposed over the substrate 100. Furthermore, a second optical measurement pattern 120 may be disposed over the substrate. Further, the second optical measurement pattern 120 is spaced apart from the first optical measurement pattern 110, and the second optical measurement pattern 120 is disposed above an upper layer of the first optical measurement pattern 110. A 3D shielding structure 200 surrounds and first optical measurement pattern 110 and may be disposed over the substrate 100. In addition, the 3D shield structure 200 receives the first optical measurement pattern 110 and includes a conductive material. The conductive material may be metal. In exemplary embodiments of the present inventive concept, the metal may include copper (Cu).

In the 3D shielding structure 200, an upper end 210 of a 3D shielding structure, which is disposed above an upper layer of the first optical pattern 110, and a lower end 220 of a 3D shielding structure, which is disposed in a lower layer of the first optical pattern 110, may be electrically connected to one another through a via structure 230. A plurality of via structures 230 may surround the first optical measurement pattern 110. Further, each via structure 230 may be separated from one another by a space and each of the via structures 230 may be spaced apart from a peripheral surface of the substrate 100 in the horizontal direction. For example, there may be a space between an edge of an upper surface of the substrate 100 and each via structure 230. In addition, the via structure 230 may be formed of a conductive material. Due to the via structure 230, the first optical measurement pattern 110 may be surrounded by a plurality of conductive materials.

Further, at least one surface of the 3D shielding structure 200 may include a mesh-type metal wiring. For example, the upper end 210 of the 3D shielding structure 200 and a lower end 220 of the 3D shielding structure 200 may include a mesh-type metal wiring. As a result, signal interference caused by the first optical measurement pattern 110 may be prevented by blocking an electromagnetic wave used for measuring the second optical measurement pattern 120 from reaching the first optical measurement pattern 110.

To obtain a shielding effect of the 3D shielding structure 200 for preventing signal interference (the occurrence of a noise on a signal) due to the first optical measurement pattern 110, the electromagnetic wave used for measurement does not need to be transmitted in the 3D shielding structure 200. For example, an input signal incident to the second optical measurement pattern 120 may be used, and a reflected signal, of the input signal, (e.g., right signal) corresponding to the second optical measurement pattern 120 is recognized by a measurement device.

In an exemplary embodiment of the present inventive concept, when the upper end 210 of the 3D shielding structure 200 includes a mesh-type metal wiring, an interval (e.g., an opening) of the mesh-type metal wiring may be smaller than a wavelength of an electromagnetic wave used for measuring the second optical measurement pattern 120. In this case, the electromagnetic wave used for obtaining a measurement of an optical measurement pattern may be visible light. Thus, an interval (e.g., an opening) of the mesh-type metal wiring may be equal to or smaller than 450 nm. However, exemplary embodiments the present inventive concept are not limited thereto. For example, an interval (e.g., an opening) of the mesh-type metal wiring forming the 3D shielding structure 200 may be adjusted according to a wavelength of an electromagnetic wave used for obtaining a measurement of an optical measurement pattern.

Referring to FIGS. 2B and 2C, in the 3D shielding structure 200, a cross-section R230 of the 3D shielding structure 200 in a horizontal direction, which is limited by the via structure 230, may be greater than a cross-section R120 of the second optical measurement pattern 120 in a horizontal direction. For example, the area (e.g. on a Cartesian plane) of the 3D shield structure 200 may be greater than an area (e.g. on a Cartesian plane) of the second optical measurement pattern 120. Furthermore, when at least one surface of the 3D shielding structure 200 is of a mesh-type, a width a of the first optical measurement pattern 110 in a short axis direction and a width b of the second optical measurement pattern 120 in a short axis direction may be greater than a width c of an interval (e.g., a width of the opening) of the mesh-type metal wiring. Further, sizes of the first and second optical measurement patterns 110 and 120 may be adjusted as desired.

A method of manufacturing the 3D shielding structure 200 will be described in detail with reference to FIG. 4. Lines dividing each layer in FIG. 2B are provided for distinguishing the different respective layers formed on the substrate 100, and might not match with layers laminated on the substrate 100.

Figure 3:
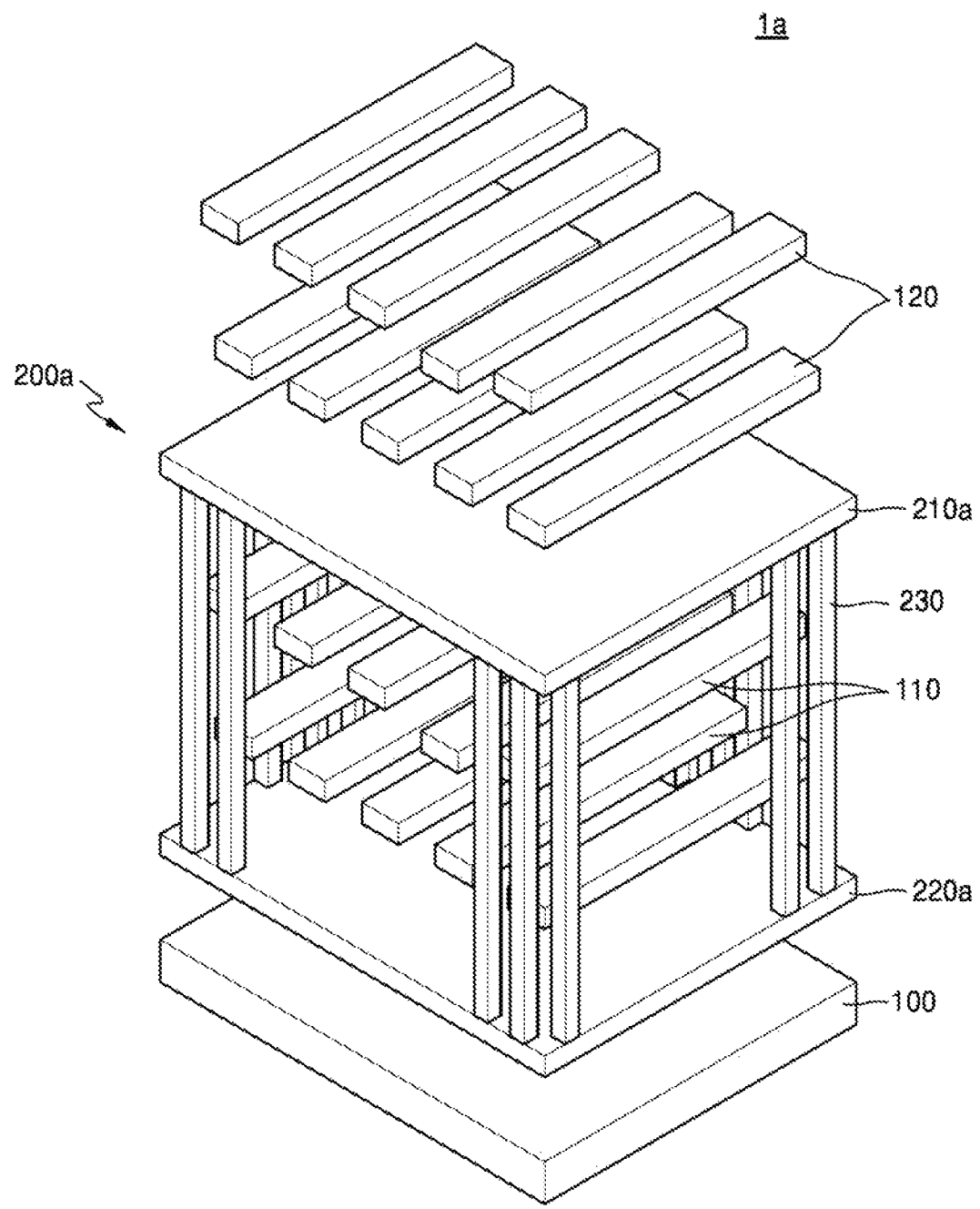
FIG. 3 is a perspective view illustrating a 3D shielding structure of a semiconductor device, according to an exemplary embodiment of the present inventive concept.

FIG. 3 is a perspective view illustrating a 3D shielding structure of a semiconductor device, according to an exemplary embodiment of the present inventive concept.

Referring to FIG. 3, a semiconductor device 1a according to an exemplary embodiment of the present inventive concept and the first optical measurement pattern 110 may be disposed on the substrate 100. Furthermore, a second optical measurement pattern 120 may be disposed over the substrate 100. Further, the second optical measurement pattern 120 may be spaced apart from the first optical measurement pattern 110 and the second optical measurement pattern 120 may be disposed above an upper layer of the first optical measurement pattern 110. A 3D shielding structure 200a, which surrounds and receives the first optical measurement pattern 110 and includes a conductive material, may be disposed over the substrate 100.

Each of an upper end 210a of the 3D shielding structure 200a and a lower end 220a of the 3D shielding structure 200a may have a plate shape and may include a conductive material. For example, the upper end 210a and lower end 200a of the 3D shielding structure 200a may be square shaped or a polygonal shape. According to an exemplary embodiment of the present inventive concept, the conductive material may include copper (Cu). However, exemplary embodiments of the present inventive concept are not limited thereto. In addition, one of the upper end 210a of the 3D shielding structure 200a and the lower end 220a of the 3D shielding structure 200a may be formed of a metal plate and the other one may be formed of a mesh-type metal wiring.

FIGS. 4A through 4G are cross-sectional views of a semiconductor device illustrating a process of manufacturing the semiconductor device, according to an exemplary embodiment of the present inventive concept. In the process of manufacturing the semiconductor device of FIGS. 4A through 4G, an upper end 210 and a lower end 220 of a 3D shielding structure 200 utilized a mesh-type metal wiring. However, exemplary embodiments of the present inventive concept are not limited thereto.

Figure 4A:
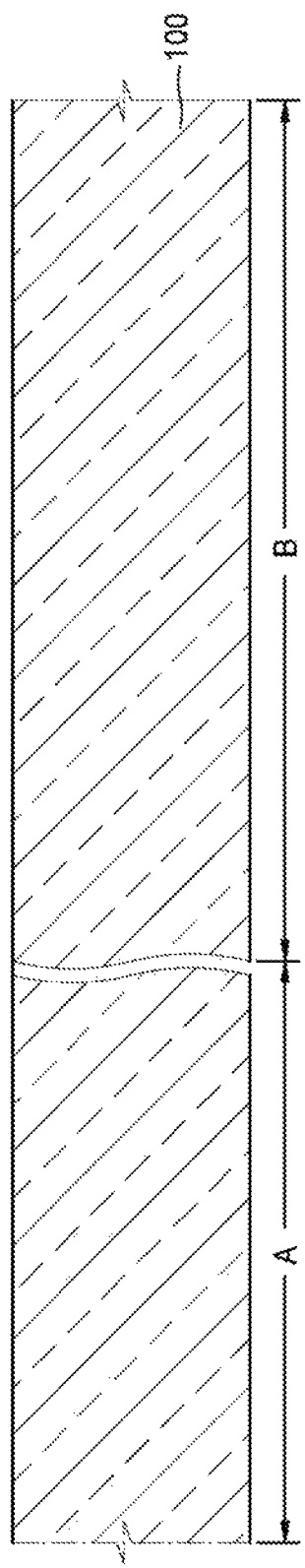

Referring to FIG. 4A, the substrate 100 may include a circuit pattern region A for forming a semiconductor device and an optical measurement pattern region B. The optical measurement pattern region B may be disposed in the scribe lane region 102 of FIGS. 1A and 1B. However, the optical measurement pattern region B is not limited thereto and may be formed in the semiconductor chip region 101 of FIGS. 1A and 1B.

Further, the substrate 100 may be a lower structure disposed on a silicon substrate during a front-end-of-the-line (FEOL) process. The lower structure may include a transistor, a lower wiring, and a lower interlayer insulating film. The FEOL process may be variously performed with respect to various semiconductor devices.

Figure 4B:
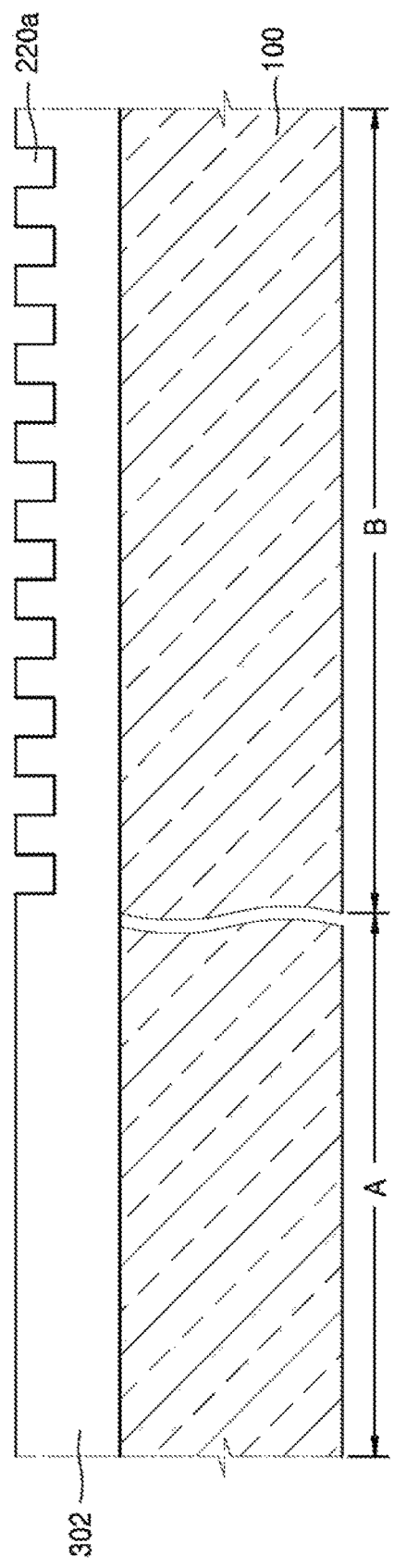

Referring to FIG. 4B, a first interlayer insulating film 302 may be disposed on the substrate 100. A 3D shielding lower end trench structure 220a may be formed on the optical measurement pattern region B by etching the first interlayer insulating film 302. Intervals of the 3D shielding lower end trench structure 220a in a short axis direction may be less than a wavelength of an electromagnetic wave used for measuring the second optical measurement pattern 120 of FIG. 2A. For example, an opening of one of the trenches of the 3D shielding lower end trench structure 220a may be less than a wavelength of an electromagnetic wave used for measuring the second optical measurement pattern 120.

Figure 4C:
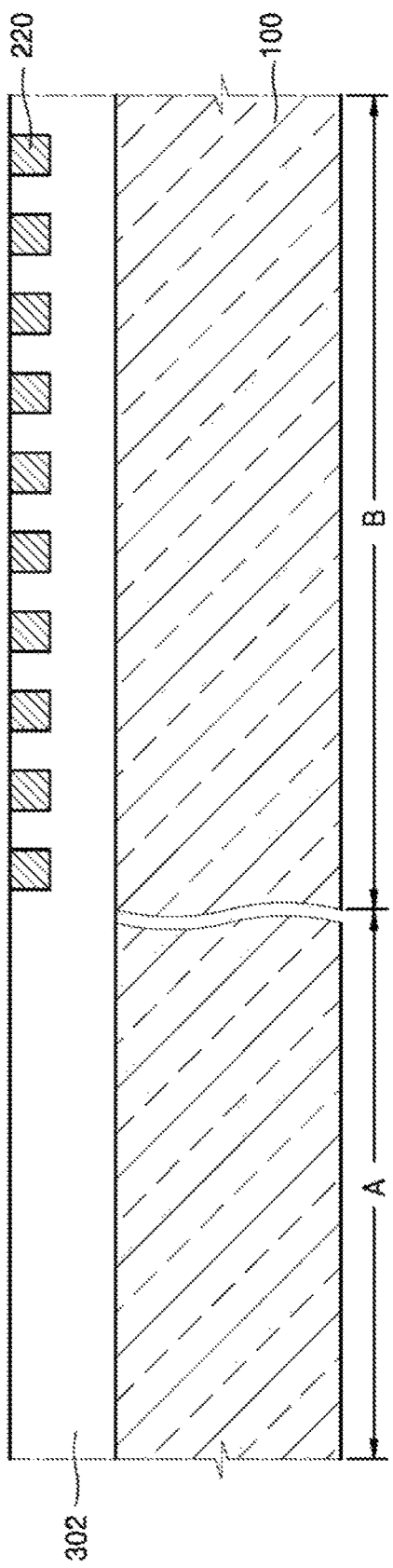

Referring to FIG. 4C, the 3D shielding lower end trench structure 220a may be filled with a conductive material. In an exemplary embodiment of the present inventive concept, a metal seed layer may be disposed on a lower surface of the 3D shielding lower end trench structure 220a. The 3D shielding structure lower end 220 may be formed by growing the metal seed layer and filling a metal layer in the 3D shielding lower end trench structure 220a. The metal layer may include copper (Cu). For example, the 3D shielding structure lower end 220 may be formed by a damascene process.

Figure 4D:
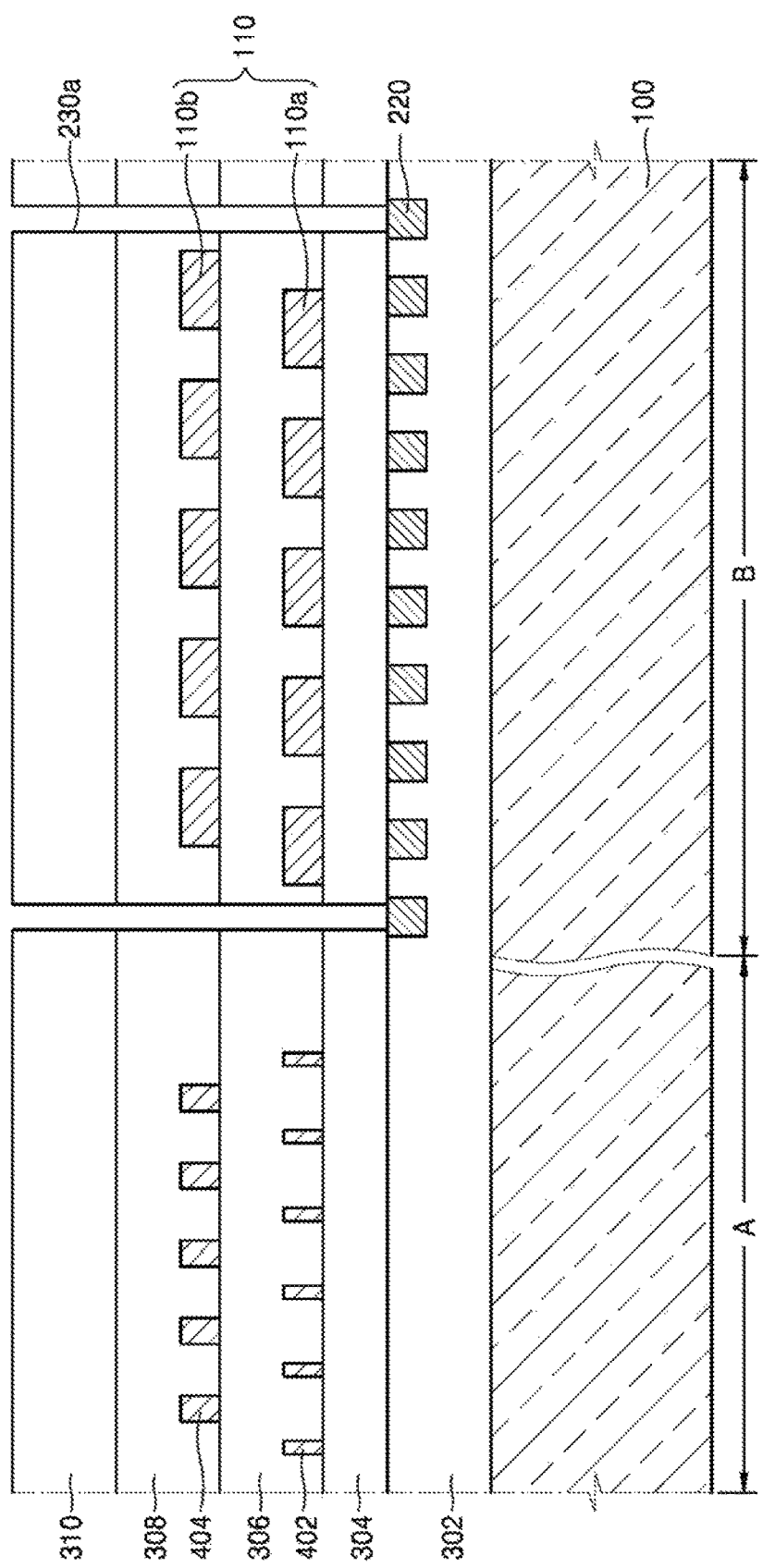

Referring to FIG. 4D, a second interlayer insulating film 304, a third interlayer insulating film 306, a fourth interlayer insulating film 308, and a fifth interlayer insulating film 310 may be sequentially stacked in a layered structure, which is disposed on the first interlayer insulating film 302 including the 3D shielding structure lower end 220. A lower pattern 110a of a first optical measurement pattern 110 and a first circuit pattern 402 may be simultaneously formed on the third interlayer insulating film 306. An upper pattern 110b of the first optical measurement pattern 110 and a second circuit pattern 404 may be simultaneously formed on the fourth interlayer insulating film 308 stacked on the third interlayer insulating film 306.

The upper pattern 110b of the first optical measurement pattern 110 may be spaced apart from a layer disposed above the lower pattern 110a of the first optical measurement pattern 110. Therefore, the first optical measurement pattern 110 may be respectively formed in at least two layers that may be spaced apart from one another. The first optical measurement pattern 110 may be a pair of optical measurement patterns. The first optical measurement pattern 110 may be a line and space pattern, and may be an overlay key for pattern alignment between a previous operation and a current operation. In addition, the first optical measurement pattern 110 may be an alignment key for aligning a substrate during a photolithography process.

The lower pattern 110a of the first optical measurement pattern 110, the upper pattern 110b of the first optical measurement pattern 110, the first circuit pattern 402, and the second circuit pattern 404 may be formed by a photolithography process. However, the present inventive concept is not limited thereto. In addition, the lower and upper patterns 110a and 110b of the first optical measurement pattern 110 may form and fill a trench region.

The lower and upper patterns 110a and 110b of the first optical measurement pattern 110 may be arranged to cross (e.g. partially overlap) one another in a direction perpendicular to that of an upper surface of the substrate 100. An electromagnetic wave used for measuring the lower and upper patterns 110a and 110b of the first optical measurement pattern 110 may be reflected and scattered by the lower and upper patterns 110a and 110b of the first optical measurement pattern 110. The lower and upper patterns 110a and 110b of the first optical measurement pattern 110 may be arranged to cross (e.g., partially overlap) one another in a direction perpendicular to that of the upper surface of the substrate 100 so that a degree of alignment of corresponding patterns may be measured based on information from a measurement device that received the reflected and scattered electromagnetic wave.

A via hole 230a penetrating through the second, third, fourth and fifth interlayer insulating films 304, 306, 308 and 310 may be formed through an etching process. A metal seed layer may be formed on a lower surface of the via hole 230a penetrating through the interlayer insulating films 304, 306, 308 and 310.

A method of forming the via hole 230a may include a process of simultaneously etching the second, third, fourth and fifth interlayer insulating films 304 306, 308 and 310.

For example, the via hole 230a and the lower and upper patterns 110a and 110b of the first optical measurement pattern 110 may be spaced apart from one another.

Figure 4E:
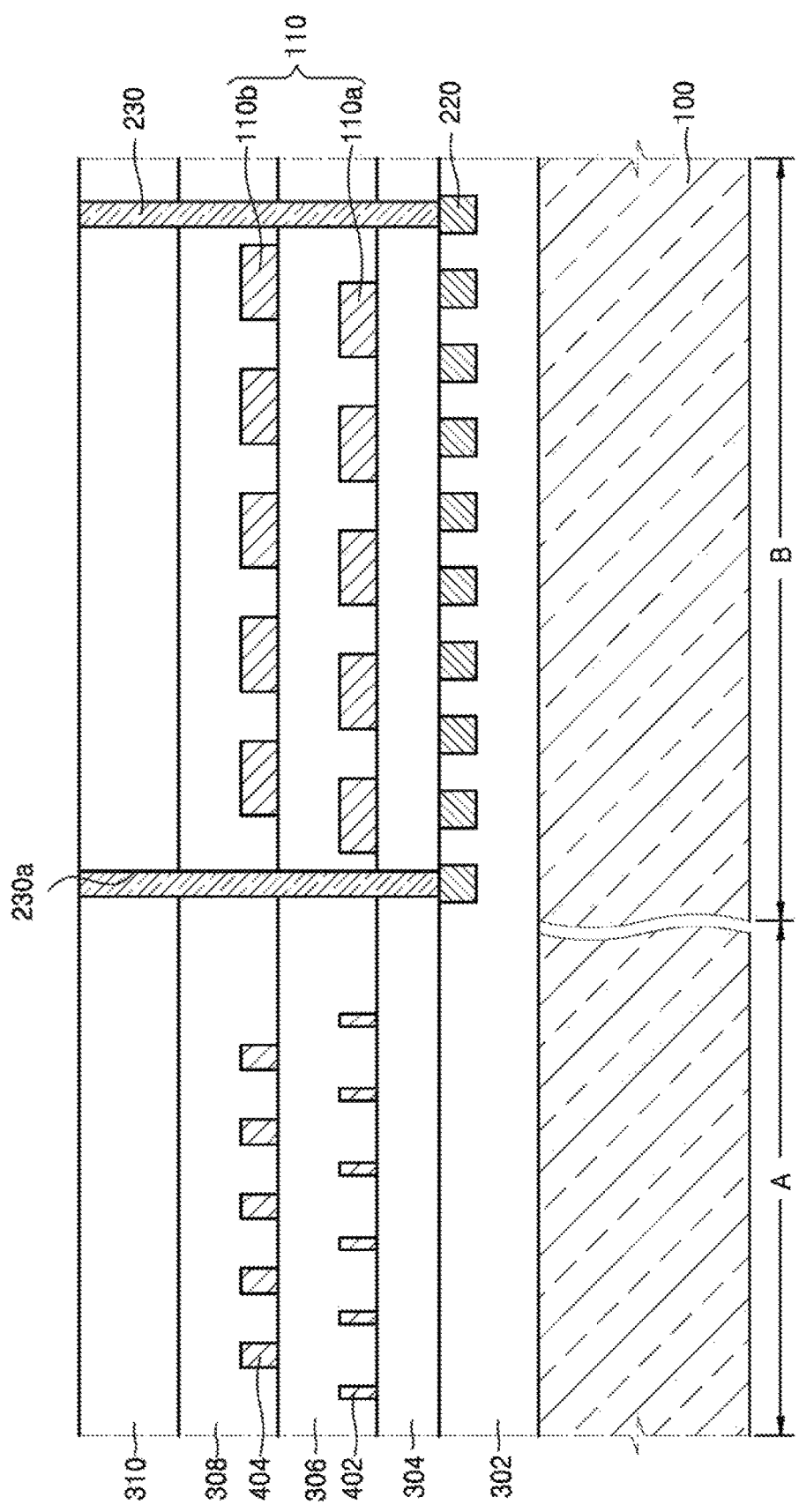

Referring to FIG. 4E, the via hole 230a may be filled with a conductive material. In an exemplary embodiment of the present inventive concept, a via plug 230 may be formed by growing the metal seed layer and filling the via hole 230a with a metal layer. The metal layer may include copper (Cu). The via plug 230 may form a via structure of a 3D shielding structure.

However, the method of forming the via structure 230 of a 3D shielding structure is not limited to the descriptions with respect to FIGS. 4D and 4E. When the second, third, fourth and fifth interlayer insulating films 304, 306, 308 and 310 are respectively formed, the via hole 230a may be formed substantially perpendicular to the first interlayer insulating film 302. In addition, the via hole 230a may be formed in each layer by using a method of forming a via hole or a line and space pattern. For example, the via hole 230a may be spaced apart from the lower and upper patterns 110a and 110b of the first optical measurement pattern 110.

Furthermore, the via plug 230 penetrating through the second, third, fourth and fifth interlayer insulating films 304, 306, 308 and 310 may be formed by using an etching process and repeating a process of filling the via hole 230a with a conductive material.

Referring to FIG. 4F, a 3D shielding upper end trench structure may be formed on the optical measurement pattern region B by etching the fifth interlayer insulating film 310. An interval between each trench of the 3D shielding upper end trench structure in a short axis direction may be less than a wavelength of an electromagnetic wave used for measuring the second optical measurement pattern 120.

The upper end 210 of the 3D shielding structure 200 may be formed by filling it with a conductive material or a metal layer in the 3D shielding upper end trench structure by using the same method as described in relation to FIG. 4C. According to an exemplary embodiment of the present inventive concept, the metal layer may include Cu. According to an exemplary embodiment of the present inventive concept, the 3D shielding structure upper end 210 may be electrically connected to the via structure 230.

Figure 4G:
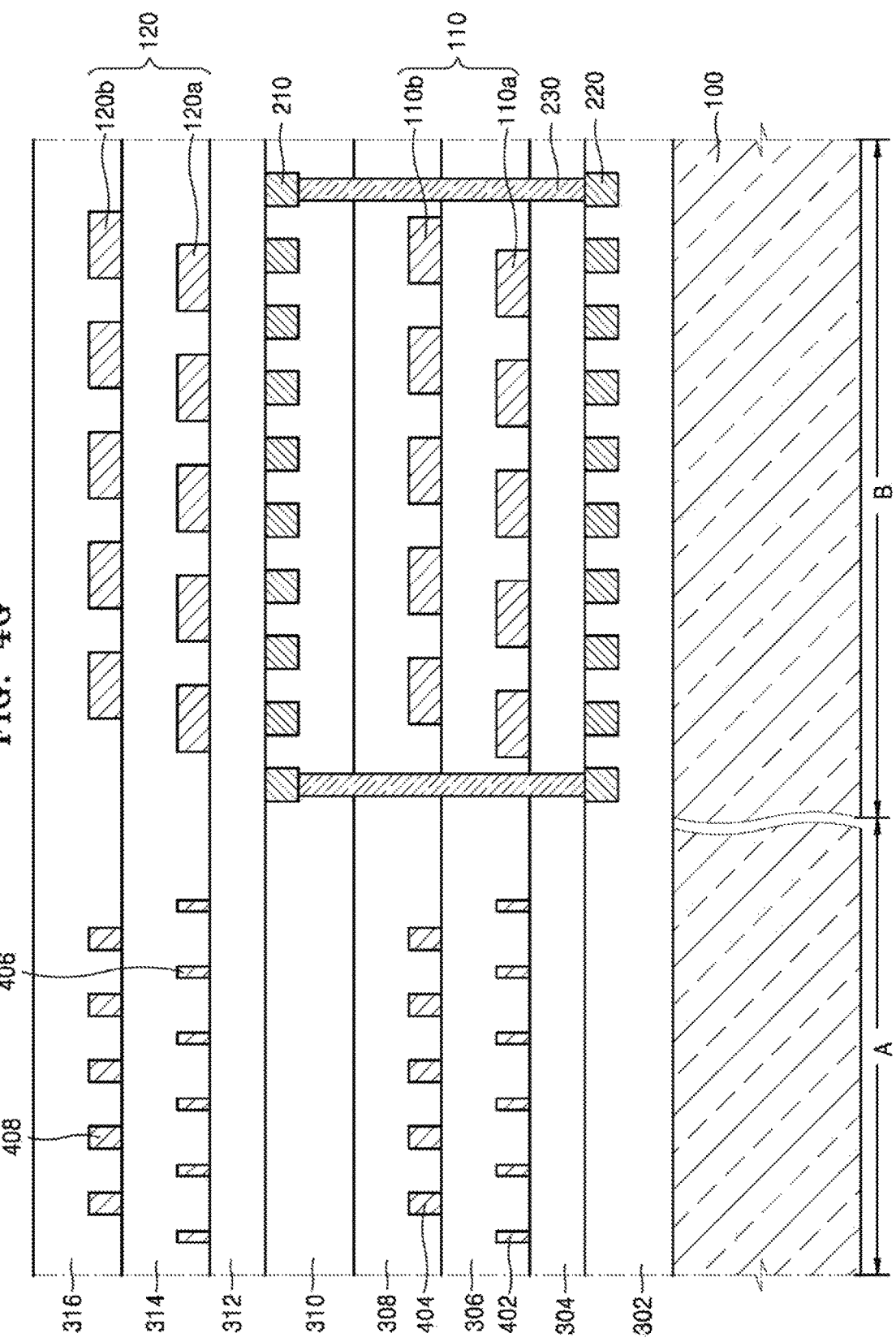

Referring to FIG. 4G, a sixth interlayer insulating film 312, a seventh interlayer insulating film 314, and an eighth interlayer insulating film 316 may be sequentially stacked in a layered structure on the fifth interlayer insulating film 310 including the 3D shielding structure upper end 210. A lower pattern 120a of the second optical measurement pattern 120 and a third circuit pattern 406 may be simultaneously formed on the seventh interlayer insulating film 314. An upper pattern 120b of the second optical measurement pattern 120 and a fourth circuit pattern 408 may be simultaneously formed on the eighth interlayer insulating film 316 disposed on the seventh interlayer insulating film 314.

The upper pattern 120b of the second optical measurement pattern 120 may be spaced apart from a layer above the lower pattern 120a of the first optical measurement pattern 120. Therefore, the second optical measurement pattern 120 may be formed in at least two layers that may be spaced apart from one another. The second optical measurement pattern 120 may be a pair of optical measurement patterns. The second optical measurement pattern 120 may be a line and space pattern, and may be an overlay key or an alignment key. Therefore, when a poor alignment occurs as a result of an overlay inaccuracy between a previous operation and a current operation during a photolithography process, coating, exposing, and developing of a photosensitive film may be repeated after removing a pattern of the photosensitive film.

The lower pattern 120a of the second optical measurement pattern 120, the upper pattern 120b of the second optical measurement pattern 120, the third circuit pattern 406, and the fourth circuit pattern 408 may be formed by a photolithography process. However, the inventive concept is not limited thereto. Further, the lower and upper patterns 120a and 120b of the second optical measurement pattern 120 may form and fill a trench region.

Here, the lower and upper patterns 120a and 120b of the second optical measurement pattern 120 may be arranged to partially overlap one another in a direction perpendicular to that of an upper surface of the substrate 100. This arrangement allows for the measurement of a degree of alignment when an electromagnetic wave used for measuring the lower and upper patterns 120a and 120b of the second optical measurement pattern 120 is reflected and scattered by the lower and upper patterns 120a and 120b of the second optical measurement pattern 120. The description of FIG. 4G is substantially the same as that of the lower and upper patterns 110a and 110b of the first optical measurement pattern 110 in FIG. 4D.

Figure 5A:
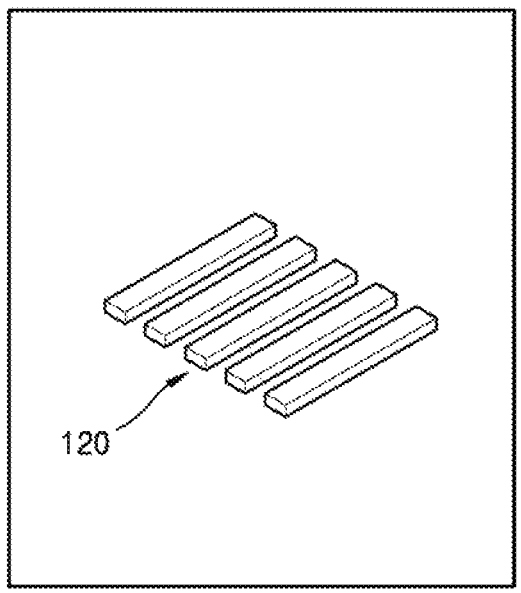
FIGS. 5A through 5C are two-dimensional (2D) maps illustrating a measurement result with regard to an optical measurement pattern according to a shape of a 3D shielding structure.
Figure 5A:
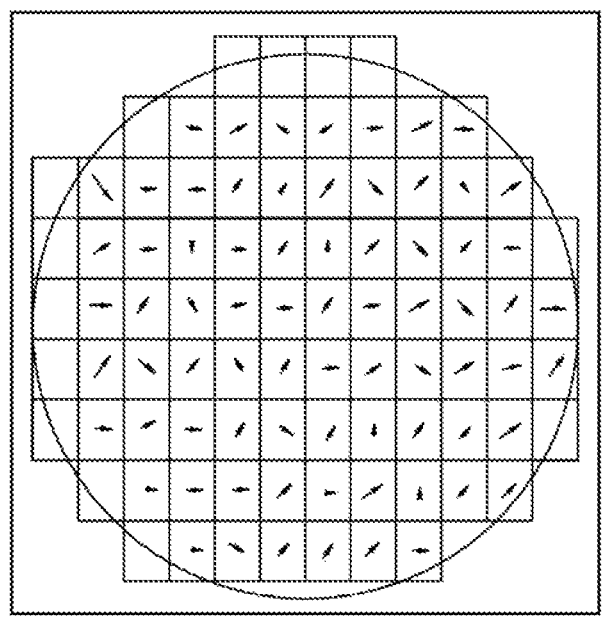
Figure 5B:
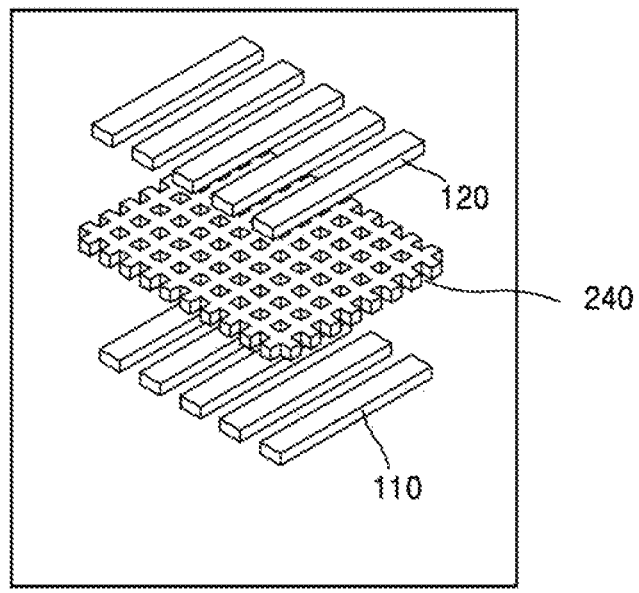
Figure 5B:
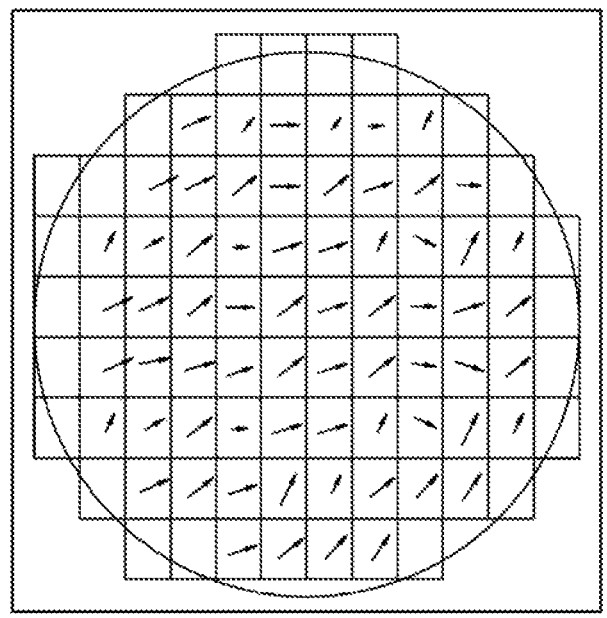
Figure 5C:
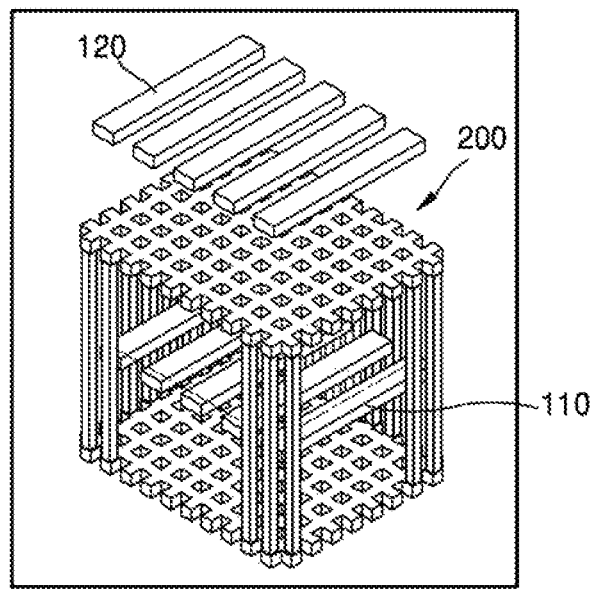
Figure 5C:
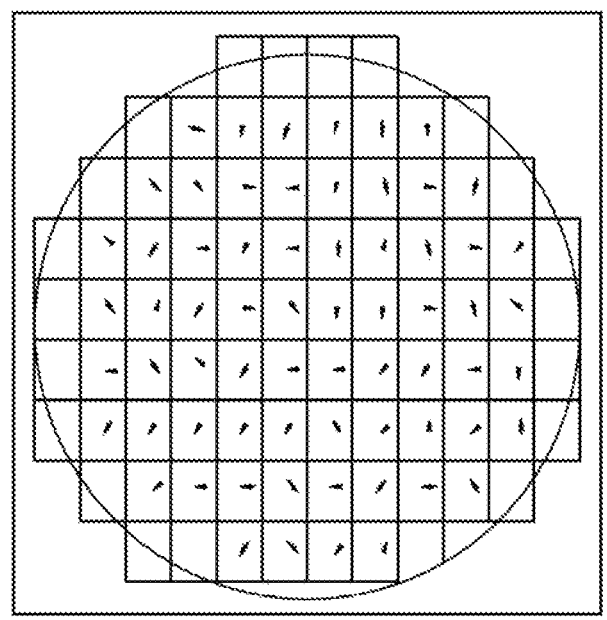

FIGS. 5A through 5C are 2D maps illustrating a measurement result of an error of an optical measurement pattern according to a shape of a 3D shielding structure. In FIG. 5A, the 2D map illustrates a measurement result of an error when only the second optical measurement pattern 120 is measured via an electromagnetic wave, according to another example. In FIG. 5B, the 2D map illustrates a measurement result of an error when the second optical measurement pattern 120 is measured when a 2D shielding structure 240 of a mesh-type is located between the first optical measurement pattern 110 and the second optical measurement pattern 120, according to another example. In FIG. 5C, the 2D map illustrates a measurement result of an error of the second optical measurement pattern 120 when the 3D shielding structure 200 according to an exemplary embodiment of the present inventive concept surrounds the first optical measurement pattern 110.

The first optical measurement pattern 110 may overlap at least a part of the second optical measurement pattern 120 in a direction perpendicular to that of an upper surface of a substrate disposed below the 3D shielding structure 200. Therefore, when an electromagnetic wave is used to measure the second optical measurement pattern 120, the measurement result may include an error if an electromagnetic wave reflected and scattered by the first optical measurement pattern 110 is also measured (e.g., detected).

Referring to FIG. 5C, regarding the 3D shielding structure 200, an upper end and a lower end thereof are mesh-type metal wirings connected to each other by a via structure including a metal. An interval pitch value of the mesh-type metal wiring used in the exemplary embodiment of the present inventive concept ranges from about 100 nm to about 200 nm, and a wavelength of the used electromagnetic wave ranges from about 425 nm to about 750 nm, which is greater than the interval pitch value of the mesh-type metal wiring. The 3D shielding structure 200 used in the present exemplary embodiment of the present inventive concept may include Cu.

Referring to FIGS. 5A and 5B, an error of FIG. 5B is greater than an error of FIG. 5A. An absolute value of an offset along an X-axis and Y-axis increases more than when only the second optical measurement pattern 120 is used. It can therefore be seen that an electromagnetic wave is not properly blocked even if the 2D shielding structure 240 having a lattice shape is disposed between the first optical measurement pattern 110 and the second optical measurement pattern 120. Therefore, an electromagnetic wave that reaches the first optical measurement pattern 110 may be scattered, and recognition of the second optical measurement pattern 120 may be disturbed.

Referring to FIGS. 5A through 5C, the 3D shielding structure 200 surrounding the first optical measurement pattern 110 may reduce an error of an optical measurement pattern. According to an exemplary embodiment of the present inventive concept, when the 3D shielding structure 200 is used, the absolute value of an offset along the X-axis and Y-axis decreases more than in the case when the 2D shielding structure 240 having a lattice shape is used. The absolute value of an offset along the X-axis and Y-axis, when the 3D shielding structure 200 is formed, may be similar to an absolute value of an offset along the X-axis and Y-axis when only the second optical measurement pattern 120 is used, without using the first optical measurement pattern 110.

Furthermore, when the 2D maps of FIGS. 5A, 5B, and 5C are compared, an experimental result of FIG. 5C is similar to an experimental result of the case when only the second optical measurement pattern 120 is measured in FIG. 5A. For example, due to the 3D shielding structure 200 surrounding the first optical measurement pattern 110, an electromagnetic wave used for obtaining a measurement may be blocked from reaching the first optical measurement pattern 110. Therefore, when the 3D shielding structure 200 surrounds the first optical measurement pattern 110 according to an exemplary embodiment of the present inventive concept, measurement accuracy of the second optical measurement pattern 120 may increase.

A photolithography process may use as many optical measurement patterns as the number of thin film layers to be aligned. Thus, the optical measurement patterns may occupy a large space on a substrate. More optical measurement patterns may be formed in the same space of a substrate when the 3D shielding structure 200 according to an exemplary embodiment of the present inventive concept is used. As a result of using the 3D shielding structure 200, a space for optical measurement patterns may be reduced.

Figure 6:
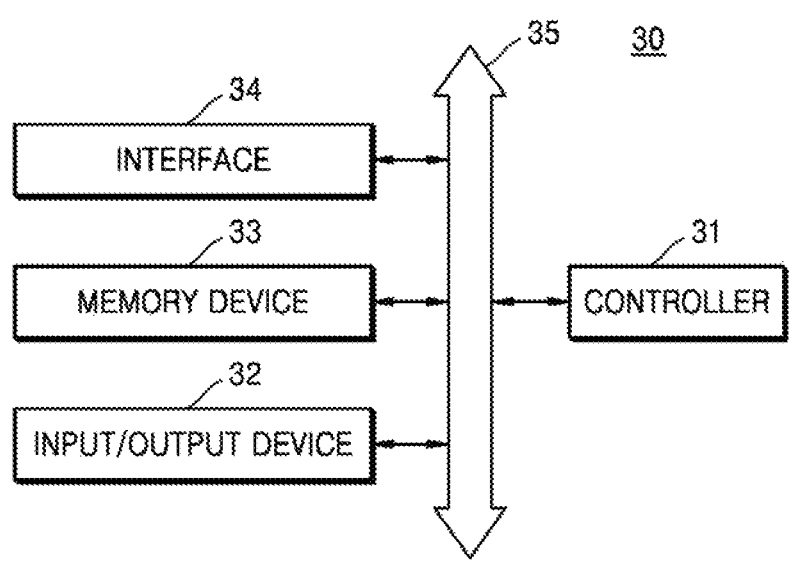
FIG. 6 is a view illustrating a system including a semiconductor device according to an exemplary embodiment of the present inventive concept.

FIG. 6 is a view illustrating a system 30 including a semiconductor device according to an exemplary embodiment of the present inventive concept.

The system 30 may include a controller 31, an input/output device 32, a memory device 33, and an interface 34. The system 30 may be, for example, a mobile system or a system transmitting and receiving information. In exemplary embodiments of the present inventive concept, the mobile system may be a personal digital assistant (PDA), a portable computer (PC), a web tablet, a wireless phone, a mobile phone, a digital music player, or a memory card. The controller 31 may control an executable program of the system 30 and may include a microprocessor, a digital signal processor, a microcontroller, or similar devices. The input/output device 32 may be used to input and/or output data to and from the system 30. The system 30 may be connected to an external device, for example, a PC or a network via the input/output device 32, and may exchange data with the external device. The input/output device 32 may be, for example, a keypad, a keyboard, or a display.

The memory device 33 may store a code and/or data for an operation of the controller 31 or data processed in the controller 31.

The interface 34 may be a data transmission path between the system 30 and an external device. The controller 31, the input/output device 32, the memory device 33, and the interface 34 may communicate with each other via a bus 35. The system 30 may be used for a mobile phone, an MP3 player, navigation, a portable multimedia player (PMP), a solid state disk (SSD), or household appliances.

The system 30 may include the semiconductor devices 1 and 1a in FIGS. 2A and 2B, and 3 according to an exemplary embodiment of the present inventive concept.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by following claims.

What is claimed is:

1. A semiconductor device comprising:
   a substrate comprising at least two semiconductor chip regions and a scribe lane region disposed between the semiconductor chip regions;
   a first optical measurement pattern disposed on the substrate;
   a second optical measurement pattern disposed on an upper layer of the first optical measurement pattern, the second optical measurement pattern being spaced apart from the first optical measurement pattern; and
   a three-dimensional (3D) shielding structure surrounding the first optical measurement pattern and comprising an electrically conductive material, and including an upper end between the first optical measurement pattern and the second optical measurement pattern, wherein the upper end is a square shaped plate.

2. The semiconductor device of claim 1, wherein
   the 3D shielding structure comprises:
   an upper end of the 3D shielding structure disposed on the upper layer of the first optical measurement pattern; and
   a lower end of the 3D shielding structure disposed in a lower layer of the first optical measurement pattern,
   wherein the upper end and lower end of the 3D shielding structure are electrically connected to one another through a via structure that surrounds the first optical measurement pattern.

3. The semiconductor device of claim 1, wherein
   the 3D shielding structure further comprises:
   a lower end of the 3D shielding structure disposed in a lower layer of the first optical measurement pattern,
   wherein the lower end of the 3D shielding structure is a square shaped plate.

4. The semiconductor device of claim 1, wherein
   the 3D shielding structure further comprises:
   a lower end of the 3D shielding structure disposed in a lower layer of the first optical measurement pattern,
   wherein the lower end of the 3D shielding structure comprises a mesh-type electrically conductive wiring.

5. The semiconductor device of claim 4, wherein
   intervals of the mesh-type including conductive wiring are smaller than a wavelength of an electromagnetic wave used for measuring the second optical measurement pattern.

6. The semiconductor device of claim 1,
   wherein the first optical measurement pattern includes at least two layers spaced apart from one another, and
   wherein the second optical measurement pattern includes at least two layers spaced apart from one another.

7. The semiconductor device of claim 1, wherein
the first optical measurement pattern overlaps at least a part of the second optical measurement pattern in a direction perpendicular to that of an upper surface of the substrate.

8. The semiconductor device of claim 1, wherein
the 3D shielding structure is disposed in the scribe lane region of the substrate.

9. A semiconductor device comprising:
a pair of first optical measurement patterns disposed over a semiconductor chip and vertically spaced apart from one another;
a pair of second optical measurement patterns spaced apart from the pair of first optical measurement patterns, the pair of second optical measurement patterns being disposed above an upper layer of the pair of first optical measurement patterns, and vertically spaced apart from one another; and
a three-dimensional (3D) shielding structure surrounding the pair of first optical measurement patterns and including at least one surface comprising a mesh-type electrically conductive wiring, wherein the mesh-type electrically conductive wiring is disposed between the pair of first optical measurement patterns and the pair of second optical measurement patterns.

10. The semiconductor device of claim 9, wherein
each of the first and second optical measurement patterns comprises line and space patterns.

11. The semiconductor device of claim 10, wherein
each of the first and second optical measurement patterns comprises an overlay key or alignment key.

12. The semiconductor device of claim 9, wherein
a width of each of the first and second optical measurement patterns in a short axis direction is greater than an interval of the mesh-type electrically conductive wiring.

13. The semiconductor device of claim 9, wherein
intervals of the mesh-type electrically conductive wiring are smaller than a wavelength of an electromagnetic wave used for measuring the pair of second optical measurement patterns.

14. The semiconductor device of claim 13, wherein
the electromagnetic wave is visible light.

15. The semiconductor device of claim 9, wherein the 3D shielding structure comprises:
an upper end of the 3D shielding structure disposed on the upper layer of the pair of first optical measurement patterns; and
a lower end of the 3D shielding structure disposed in a lower layer of the pair of first optical measurement patterns,
wherein the upper end and lower end of the 3D shielding structure are electrically connected to one another through a via structure surrounding the pair of first optical measurement patterns, and
wherein a cross-section of the 3D shielding structure in a horizontal direction is greater than a cross-section of the pair of second optical measurement patterns in the horizontal direction.

16. A semiconductor device comprising:
a substrate;
a pair of first optical measurement patterns disposed over the substrate and spaced apart from one another;
a pair of second optical measurement patterns spaced apart from one another and disposed over the pair of first optical measurement patterns; and
a three-dimensional (3D) shielding structure surrounding the pair of first optical measurement patterns and comprising an upper end and a lower end, wherein the upper end of the 3D shielding structure is a square shaped plate comprising an electrically conductive material, or a mesh-type conductive wiring.

17. The semiconductor device of claim 16, wherein the lower end of the 3D shielding structure is a square shaped plate comprising an electrically conductive material, or a mesh-type electrically conductive wiring.

18. The semiconductor device of claim 16, wherein the upper end and lower end of the 3D shielding structure are electrically connected to one another through a via structure that surrounds the pair of first optical measurement patterns.

19. The semiconductor device of claim 17, wherein the mesh-type electrically conductive wiring comprises an interval equal to or less than 450 nm.

20. The semiconductor device of claim 16, wherein the first pair of first optical measurement patterns and the pair of second optical measurement patterns each include an upper layer and a lower layer, wherein the upper layer vertically overlaps at least a part of the lower layer in a direction perpendicular to that of an upper surface of the substrate.

* * * * *